United States Patent [19]

Taki et al.

[11] Patent Number: 5,372,186
[45] Date of Patent: Dec. 13, 1994

[54] RADIATOR ASSEMBLY FOR SUBSTRATE

[75] Inventors: Naoya Taki, Toyonaka; Narumi Hirota, Ibaraki, both of Japan

[73] Assignee: Matsushita Electric Industrial Co., Ltd., Kadoma, Japan

[21] Appl. No.: 67,837

[22] Filed: May 27, 1993

[30] Foreign Application Priority Data

May 29, 1992 [JP] Japan ............................. 4-36348[U]
May 29, 1992 [JP] Japan ............................. 4-36349[U]

[51] Int. Cl.⁵ ................................................ H05K 7/20
[52] U.S. Cl. .................................... 165/50.3; 361/690
[58] Field of Search ................. 165/80.2, 80.3, 185; 361/690, 702, 703; 174/16.1, 16.3

[56] References Cited

U.S. PATENT DOCUMENTS 4,444,994 4/1984 Baker et al. .
4,594,643 6/1986 Hermann ..................... 361/703 X
4,620,263 10/1986 Ito ............................... 361/690
4,710,852 12/1987 Keen .......................... 174/16.3 X

FOREIGN PATENT DOCUMENTS 59-72744 5/1984 Japan .
62-63946 4/1987 Japan .
62-91495 6/1987 Japan .
2052164 1/1981 United Kingdom ........... 361/690
2201041 8/1988 United Kingdom .

*Primary Examiner*—John C. Fox
*Attorney, Agent, or Firm*—Cushman, Darby & Cushman

[57] ABSTRACT

A radiator (3) is coupled by caulked joints with fitting plates (5, 15) fixed to the substrate (8) by soldering. By heat-conductively attaching the fitting plate (5, 15) to both sides of the radiator (3), apertures (7) for receiving a prying tool (6) are formed between the radiator (3) and the fitting plate (5, 15). The fitting plate (5, 15) is pried open by the typical tool, thereby the radiator (3) is easily separated from the substrate (8) in order to be used as recycling resources.

5 Claims, 5 Drawing Sheets

RADIATOR ASSEMBLY FOR SUBSTRATE

FIELD OF THE INVENTION AND RELATED ART STATEMENT

1. Field of the Invention

The present invention relates to a radiator assembly fixed to a substrate via soldered metal plate, and particularly it relates to a radiator which can be separated or disassembled from a substrate by using a typical common tool in order to be used as recycling resources after retirement of the assembly including the radiator.

2. Description of the Related Art

Recently, an aluminum radiator, which is manufactured by an extrusion molding, is widely used in an electronic apparatus, which comprises a substrate having many electronic devices mounted at high density. The radiator is usually made of aluminum block since it can be manufactured by easy treatment and have excellent heat-conductivity. Such aluminum radiators prevent the appearance of malfunction or destruction caused by heat of an electronic device, such as a semiconductor device. And the semiconductor device attached to such aluminum radiator is operated in excellent performance.

In view of an environmental disruption of the globe and the recycling of resources, disassembly and classification of the electronic apparatus to be scrapped have lately been attracting considerable attention. It becomes one of the most important matter in an electronic apparatus in recent years that many kinds of electronic devices in electronic apparatus are assembled so as to be easily disassembled and classified into same material in order to recycle the resources. Particularly, since the large block of aluminum wares were made by consuming a great amount of electricity in smelting, the aluminum ware is preferably used in recycling.

Next, a way of disassembly for such aluminum ware, especially a conventional aluminum radiator, is described with reference to FIG. 5. FIG. 5 is a perspective view of the conventional aluminum radiator 30 mounted on a substrate 80. As shown in FIG. 5, a semiconductor device 10 to be cooled is fixed to the conventional aluminum radiator 30 through an insulation sheet 20 such as a mica sheet by tightening a screw 40. Since the aluminum radiator 30 can not be fixed directly to the substrate 80 by soldering, the aluminum radiator 30 is fixed to metal plates 50 by caulked joints 30a, and the metal plates 50 formed in a flat plate are fixed to the substrate 80 by soldering. By the above-mentioned way, the conventional aluminum radiator 30 is firmly fixed to the substrate 80 usually.

Therefore, in case that the electronic apparatus is retired, it is desirable that many kinds of the electronic devices in the electronic apparatus are disassembled and classified in the same material. However, the conventional radiator 30 of the electronic device can not be easily separated from the substrate 80 by a typical or ordinary tool, and semiconductor device only can be separated from the conventional radiator 30 by removing the screw 40 with a screwdriver tool. As a result, the substrate 80 having the conventional radiator 30 must be scrapped with the other electronics in spite of the usable material as recycling resources.

OBJECT AND SUMMARY OF THE INVENTION

An object of the present invention is to provide a radiator assembly which can be easily separated from a substrate of an electronic apparatus in order to be used as recycling resources in a manner of a typical tool when the electronic apparatus is retired.

In order to achieve the above-mentioned object, the radiator assembly for a substrate comprises:

a substrate for mounting an electronic device;

a fitting plate fixed to the substrate by at least a welding joint; and a radiator for cooling an electronic device which is heat-conductively attached to the radiator which is coupled to the fitting plate by mechanical connecting means, the radiator having at least a hollow for forming at least an aperture for receiving a pry tool between the fitting plate and the radiator.

And, another radiator assembly in accordance with the present invention comprises:

a substrate for mounting an electronic device;

a radiator for cooling the electronic device which is heat-conductively attached to the radiator: and a fitting plate which is fixed to the substrate by at least a welding joint, the fitting plate being coupled to the radiator by mechanical connecting means, the fitting plate having swelled portions for forming apertures for receiving a pry tool between the fitting plate and the radiator.

In the radiator assembly in accordance with the present invention which is configured above, the radiator assembly is constructed to have apertures between the radiator and the fitting plate so as to be inserted a typical tool for separating between the radiator and the fitting plate. When an electronic device, such as a semiconductor device fitted to the radiator assembly is retired, a radiator of the radiator assembly can be easily separated from the fitting plate fixed to the substrate a manner that the apertures are pried open with a typical tool, such as screwdriver thereby the separated radiator can be used as recycling resources.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all the Figures are schematic representations for purposes of illustration and do not necessarily depict the actual relative sizes or locations of the elements shown.

DESCRIPTION OF THE PREFERRED EMBODIMENTS

Hereafter, radiator assemblies to be mounted on a substrate as preferred embodiments of the present invention are described with reference to the accompanying drawings of FIGS. 1 to 4.

Figure 1:
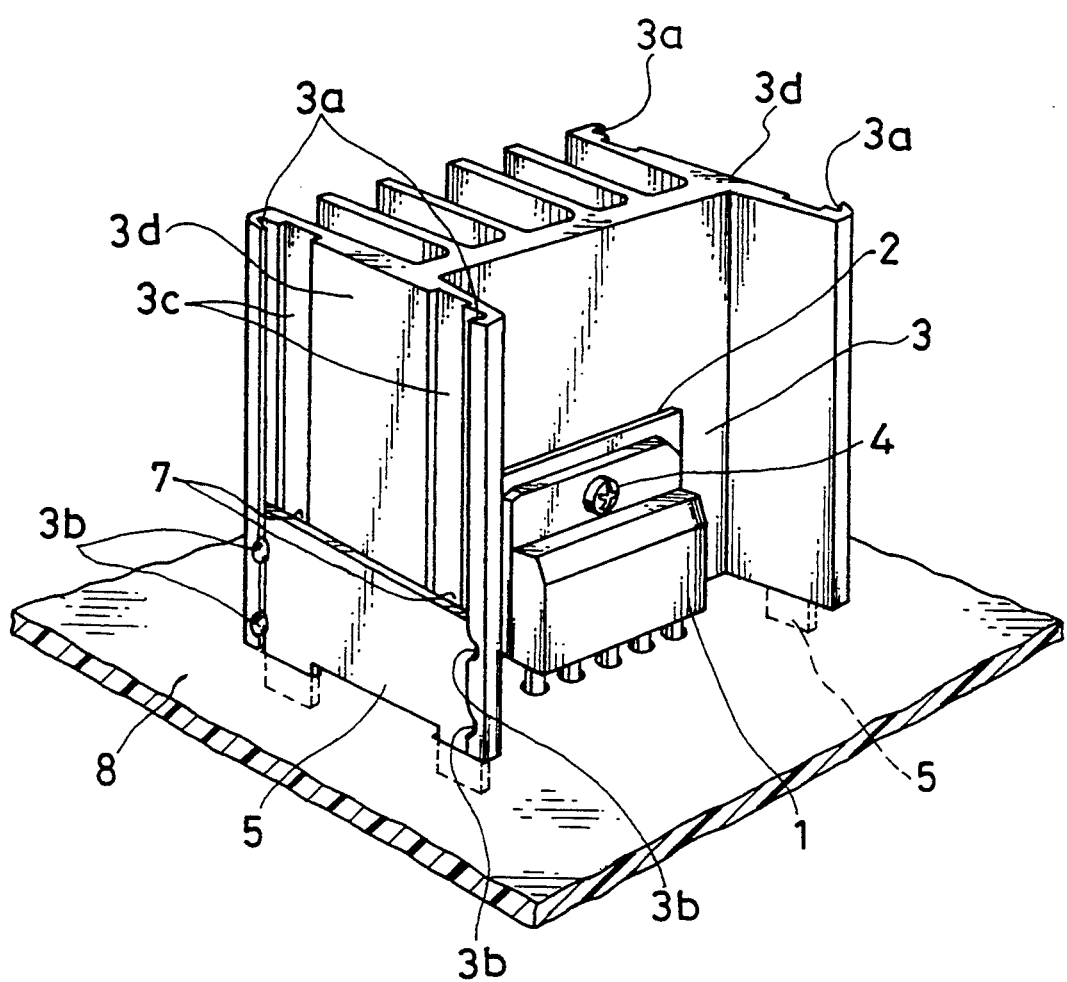
FIG. 1 is a perspective view showing a radiator assembly of a first embodiment of the present invention.
Figure 2:
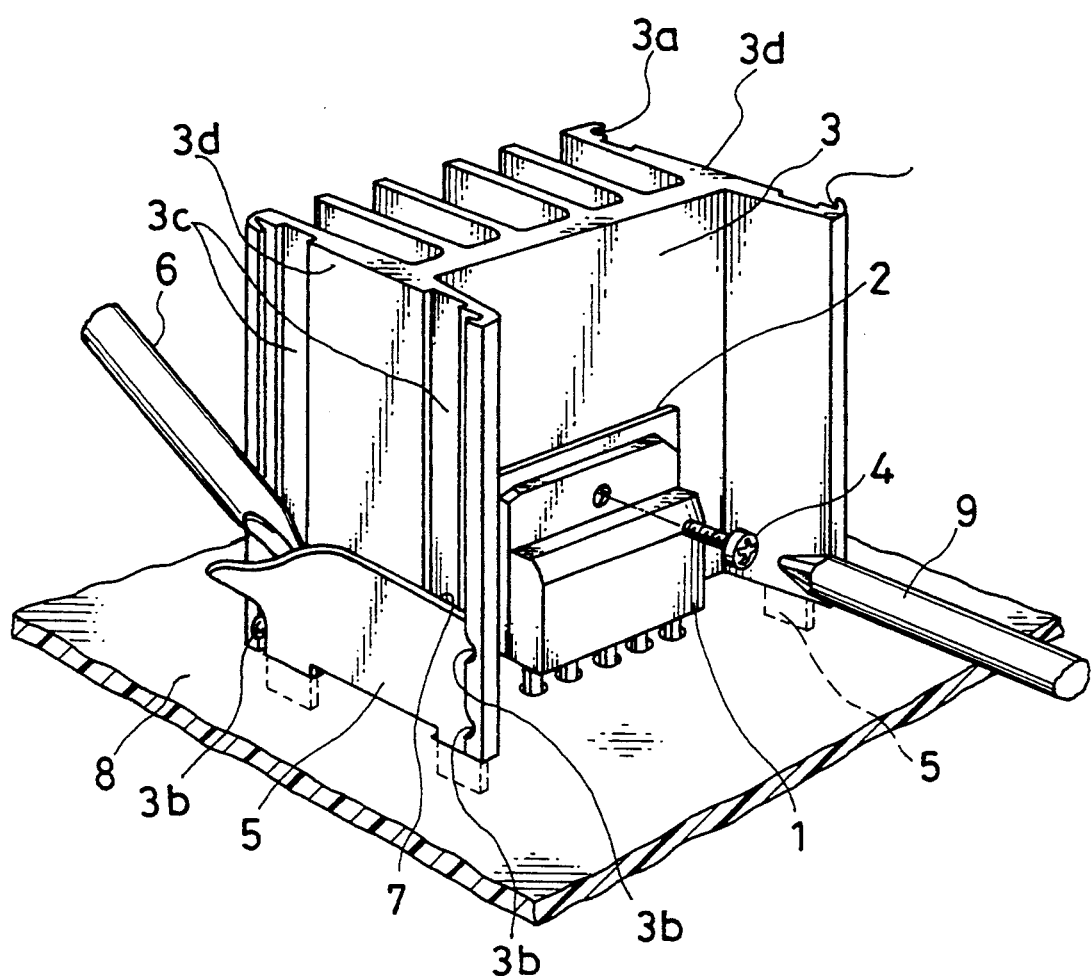
FIG. 2 is a perspective view showing the radiator assembly of FIG. 1 on a way of a disassembly.

FIG. 1 is a perspective view showing a radiator assembly of the first embodiment embodying the present invention. FIG. 2 is a perspective view showing the radiator assembly of FIG. 1 on a way of a disassembly.

In FIG. 1, a semiconductor device 1 is thermoconductively attached to a radiator 3 with an insulation sheet 2 such as a mica sheet by tightening a screw 4 inbetween. The radiator 3 having plural cooling fins is manufactured by an extrusion molding of aluminum. Two metallic fitting plates 5, 5 are attached to the radiator 3 at both side faces. The fitting plate 5 is slid and fitted into each-other-opposing two grooves 3a, 3a, which are formed on vertical edge portions of side wall 3d of the radiator 3 as shown in FIG. 1. The fitting plate 5 is firmly fixed at the predetermined position of the side wall 3d by caulking at plural portions 3b, 3b, 3b, 3b of guide rails of the grooves 3a, 3a. The side wall 3d is formed to have two belt-shaped hollows 3c, 3c, namely two substantially vertical straight grooves. Two apertures 7, 7 are formed by attaching the fitting plates 5 to the side wall 3d of the radiator 3, because the side wall 3d has the belt-shaped hollows 3c, 3c. The apertures 7 are arranged to be close to the caulked joints 3b connecting between the fitting plate 5 and the side wall 3d of the radiator 3. The aperture 7 have a grooved shape to be easily inserted by a typical tool, such as a slotted screwdriver 6. The radiator 3 is firmly fixed to the substrate 8 in a manner that the fitting plates 5 are fixed to the substrate 8 by soldering.

Next, with reference to FIGS. 1 and 2 description is made on a way of separating or disassembling the above-mentioned radiator assembly, which has been fixed to the substrate 8 through the fitting plates 5 by caulking and soldering.

In case the radiator 3 fixed to the substrate 8 as shown in FIG. 1 is separated from the substrate 8, the semiconductor device 1 is initially separated from the radiator 3 by removing the screw 4 with a typical tool, such as a Philip screwdriver 9 as shown in FIG. 2.

In the next step, the aperture 7, which is formed by attaching the fitting plate 5 to the side wall 3d having the belt-shaped hollows 3c, is inserted by a slotted screwdriver 6. And, the fitting plate 5 is pried from the side wall 3d by pushing in the slotted screwdriver 6 in the aperture 7 thereby removing the caulked edge part of the fitting plate 5 from the caulked joints 3b as shown in FIG. 2.

Then, into the other aperture 7, which is arranged on the same side wall 3d (right side aperture in FIG. 2), the slotted screwdriver 6 is also inserted and the other aperture 7 is pried open, thereby removing the fitting plate 5 from the side wall 3d of the radiator 3. As a result, the radiator 3 is separated from one fitting plate 5.

Separation of the radiator 3 from the other fitting plate 5 (which is hidden behind the radiator 3 in FIG.2) is carried out in the same way as the abovementioned separating. Consequently, the aluminum radiator 3 is entirely removed from the substrate 8 for use as recycling resources.

Figure 3:
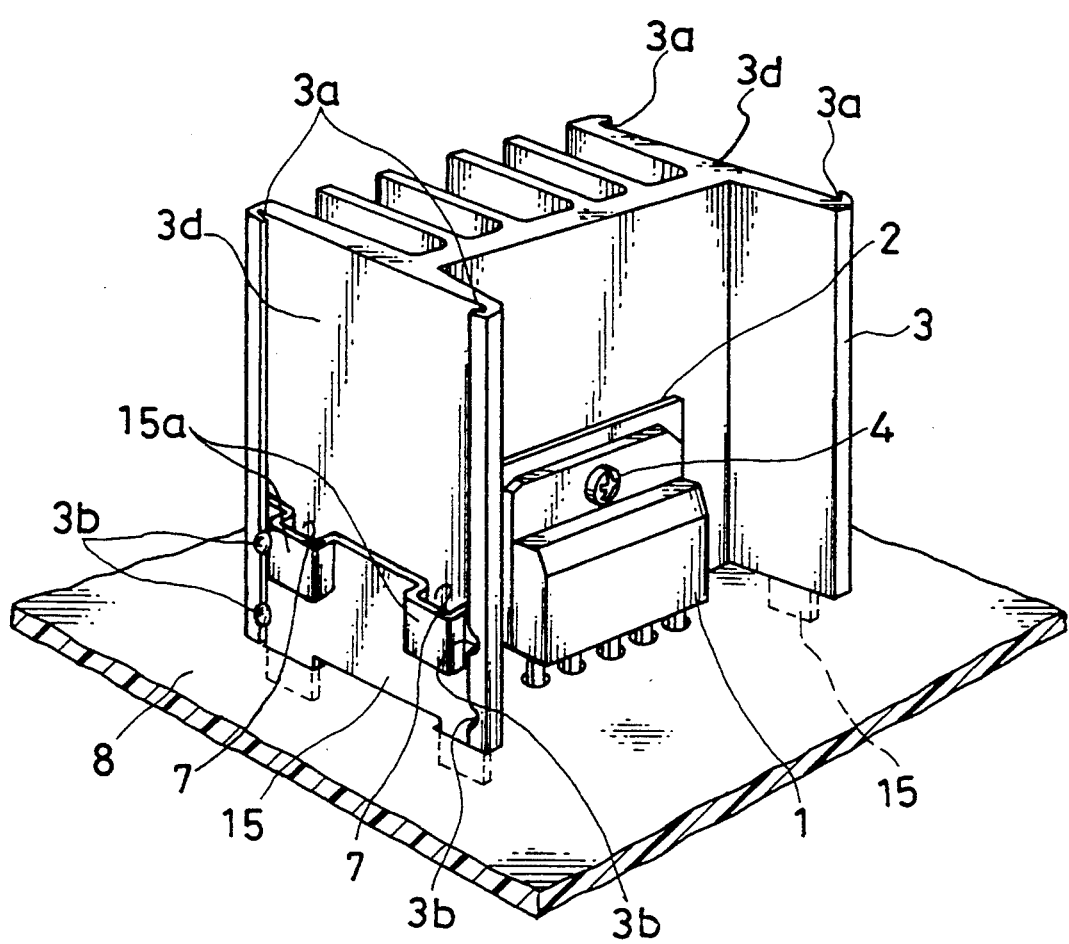
FIG. 3 is a perspective view showing a radiator assembly of a second embodiment of the present invention.
Figure 4:
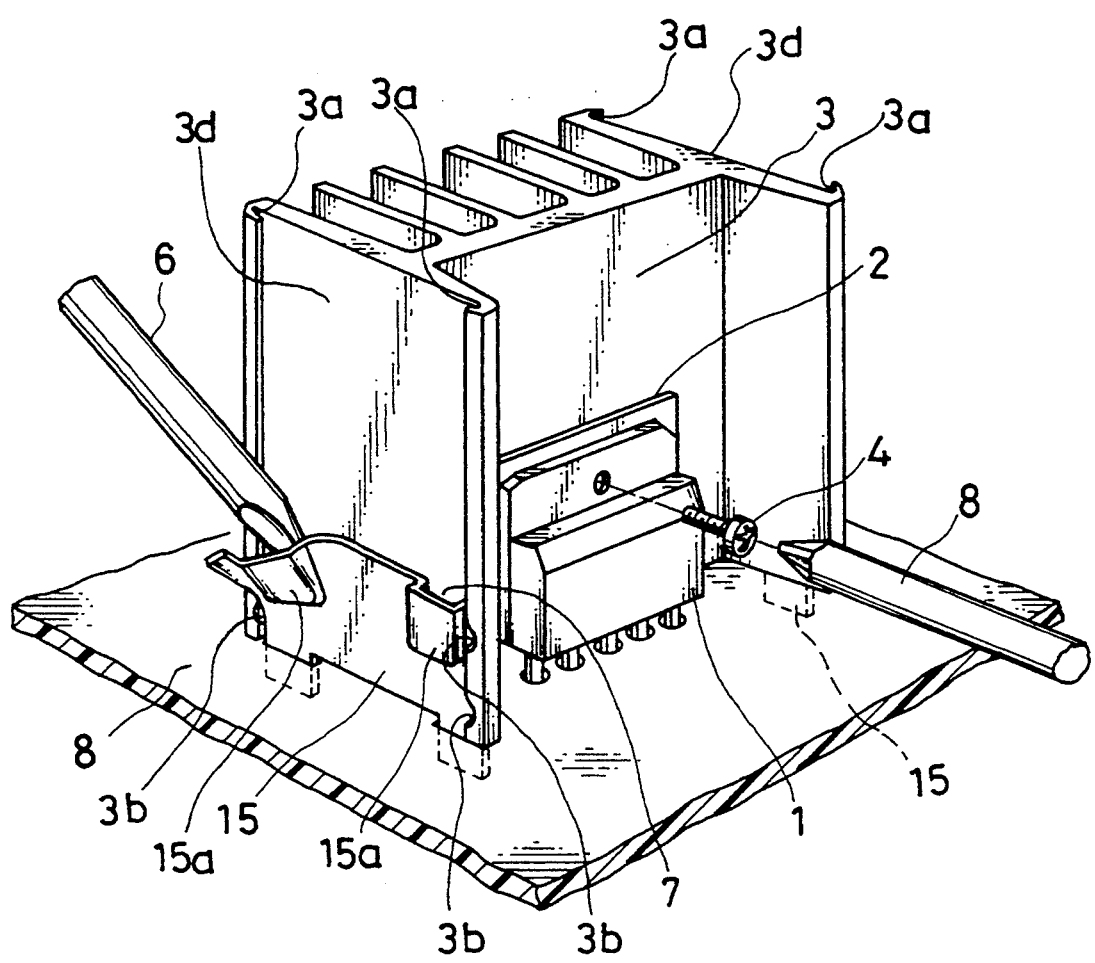
FIG. 4 is a perspective view showing the radiator assembly of FIG. 3 on a way of a disassembly.
Figure 5:
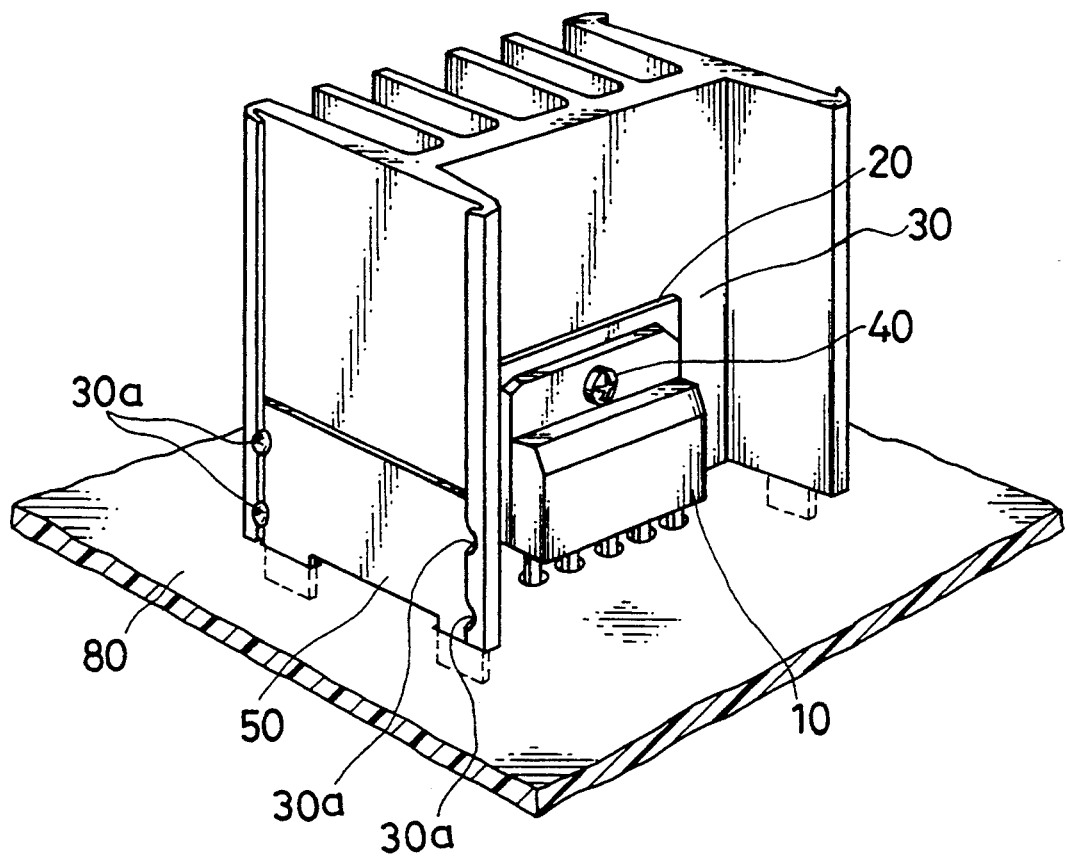
FIG. 5 is the perspective view showing the conventional radiator mounted on the substrate.

Hereafter, a second embodiment of a radiator assembly for a substrate in accordance with the present invention is described concerning the accompanying drawings of FIGS. 3 and 4. FIG. 3 is a perspective view showing a radiator assembly of the second embodiment embodying the present invention. FIG. 4 is a perspective view showing the radiator assembly of FIG. 3 on a way of a disassembly. Corresponding parts and components to the first embodiment are shown by the same numerals and marks, and the description thereon made in the first embodiment similarly apply. Differences and features of this second embodiment from the first embodiment are as follows.

In FIG. 3, a semiconductor device 1 is thermoconductively attached to a radiator 3 with an insulation sheet 2, such as a mica sheet, by tightening a screw 4 inbetween. The radiator 3 having plural cooling fins is manufactured by an extrusion molding of aluminum. Two metallic fitting plates 15, 15 are attached to the radiator 3 at both side faces. The fitting plate 15 is slid and fitted into each-other-opposing two grooves 3a, 3a, which are formed vertical on edge portions of side wall 3d of the radiator 3 as shown in FIG. 3. The fitting plate 15 is firmly fixed at the predetermined position of the side wall 3d by caulking at plural portions 3b, 3b. 3b, 3b of guide rails of the grooves 3a, 3a. The fitting plate 15 is formed to have two swelled portions 15a, 15a like two pockets. Two apertures 7, 7 are formed by attaching the fitting plate 15 to the side wall 3d of the radiator 3 because the fitting plate 15 has the swelled portions 15a. The apertures 7 are arranged close to the caulked joints 3b connecting between the fitting plate 15 and the side wall 3d of the radiator 3. The aperture 7 have a slotted shape so as to easily receive a typical tool, such as a slotted screwdriver 6. The radiator 3 is firmly fixed to the substrate 8 in a manner that the fitting plates 15 are fixed to the substrate 8 by soldering.

Next, with reference to FIGS. 3 and 4 description is made on a way of separating or disassembling the abovementioned radiator assembly from the substrate 8.

In case the radiator 3 fixed to the substrate 8 as shown in FIG. 3 is separated from the substrate 8. The semiconductor device 1 is initially separated from the radiator 3 by removing the screw 4 with a typical tool, such as a Philip screwdriver 9 as shown in FIG. 4.

In the next step, a slotted screwdriver 6 is inserted into the aperture 7, which is formed by attaching the fitting plate 15 having swelled portions 15a to the side wall 3d. And, the fitting plate 15 is pried from the side wall 3d by pushing the slotted screwdriver 6 in the aperture 7 so as to break the caulked Joints 3b as shown in FIG. 4.

Then, into the other aperture 7, which is arranged on the same side wall 3d (right side aperture in FIG. 4), the slotted screwdriver 6 is also inserted and the other aperture 7 is pried open, thereby removing the fitting plate 15 from the side wall 3d of the radiator 3. As a result, the radiator 3 is separated from one fitting plate 15.

Separation of the radiator 3 from the other fitting plate 15 ( which is hidden behind the radiator 3 in FIG. 4 ) is carried out in the same way as the abovementioned separating. Consequently, the aluminum radiator 3 is entirely removed from the substrate 8 for use as recycling resources.

Apart from the above-mentioned embodiments wherein the radiator 3 and the fitting plate 5 or 15 are coupled by the caulked joints, a modified embodiment may be such that the radiator and the fitting plate are coupled by optional mechanical coupling means, such as pressure welding, rivet joint.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An electrical apparatus comprising:

a substrate for mounting an electronic device;

a fitting plate fixed to said substrate by at least one welding joint; and a radiator for cooling an electronic device which is heat-conductively attached to said radiator which is coupled to said fitting plate by mechanical connecting means, one of said fitting plate and said radiator having surfaces defining a channel therein, said channel being constructed and arranged to receive a tool to remove said fitting plate from said radiator.

2. An electrical apparatus in accordance with claim 1 wherein, said radiator includes at least one hollow portion defining said channel between said radiator and a surface of said fitting plate.

3. An electrical apparatus in accordance with claim 1 wherein said radiator is coupled to said fitting plate by caulked joints, and said fitting plate is fixed to said substrate by soldering.

4. An electrical apparatus in accordance with claim 1 wherein said fitting plate has swelled portions defining said channel between said fitting plate and a surface of said radiator.

5. An electrical apparatus in accordance with claim 4 wherein, said radiator is coupled to said fitting plate by caulked joints, and said fitting plate is fixed to said substrate by soldering.

* * * * *